(12) United States Patent
Fukumoto et al.

(10) Patent No.: US 11,637,123 B2
(45) Date of Patent: Apr. 25, 2023

(54) SEMICONDUCTOR DEVICE AND MANUFACTURING METHOD THEREOF

(71) Applicant: Kioxia Corporation, Minato-ku (JP)

(72) Inventors: Atsushi Fukumoto, Kuwana (JP); Keisuke Suda, Yokkaichi (JP); Takayuki Ito, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/989,168

(22) Filed: Aug. 10, 2020

(65) Prior Publication Data

US 2021/0082952 A1 Mar. 18, 2021

(30) Foreign Application Priority Data

Sep. 13, 2019 (JP) .............................. JP2019-167173

(51) Int. Cl.
*H01L 27/00* (2006.01)
*H01L 27/11582* (2017.01)
*H01L 21/3213* (2006.01)
*H01L 21/311* (2006.01)

(52) U.S. Cl.
CPC ...... *H01L 27/11582* (2013.01); *H01L 21/311* (2013.01); *H01L 21/32133* (2013.01)

(58) Field of Classification Search
CPC ............. H01L 27/11582; H01L 27/112; H01L 27/115; H01L 27/1156
See application file for complete search history.

(56) References Cited

U.S. PATENT DOCUMENTS

| | | | |
|---|---|---|---|
| 6,495,294 B1 | 12/2002 | Yamauchi et al. | |
| 9,793,283 B1 * | 10/2017 | Pang ................. | H01L 21/02381 |
| 2011/0287629 A1 | 11/2011 | Kakimoto et al. | |
| 2015/0243672 A1 * | 8/2015 | Kim ................... | H01L 27/1157 |
| | | | 257/324 |
| 2018/0182851 A1 * | 6/2018 | Van Houdt ............ | H01L 45/06 |

FOREIGN PATENT DOCUMENTS

| | | |
|---|---|---|
| JP | 2001-196573 A | 7/2001 |
| JP | 2005-51045 A | 2/2005 |
| JP | 2012-4542 A | 1/2012 |

OTHER PUBLICATIONS

Abbadie et al., "An Efficient Wet-Cleaning of SiGe Virtual Substrates and of Thick, Pure Ge Layers on Si(001) After a Chemical Mechanical Planarization Step", Microelectronic Engineering 83.10 (2006), pp. 1986-1993.
Leinenbach et al., "Surface Micromachining", Handbook of Silicon Based MEMS Materials and Technologies (Second Edition) 2015, pp. 525-539.

* cited by examiner

*Primary Examiner* — Reema Patel
(74) *Attorney, Agent, or Firm* — Oblon, McClelland, Maier & Neustadt, L.L.P.

(57) ABSTRACT

A semiconductor device according to one embodiment is provided with: a substrate; a stacked body provided on the substrate; and a pillar portion penetrating the stacked body. The pillar portion has a first film including a first material and a second material, and a second film provided on an inner side of the first film. The second material is a material that increases an etching rate of the first material as a composition rate relative to the first material is higher, and the composition rate gradually decreases from an upper part to a lower part of the first film.

6 Claims, 6 Drawing Sheets

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2019-167173, filed on Sep. 13, 2019; the entire contents of which are incorporated herein by reference.

FIELD

Embodiments of the present invention relate to a semiconductor device and a manufacturing method thereof.

BACKGROUND

At the time of manufacturing a three-dimensional stacked semiconductor memory that is one of semiconductor devices, a stacked body obtained by stacking a plurality of electrode layers is formed as a workpiece. Furthermore, a pillar portion is formed as a film in this stacked body.

The pillar portion is formed as a film by embedding a film material in a hole or a groove penetrating the stacked body. At this time, if a middle part of the hole or the groove is curved outward, a cavity (a seam) may occur in the pillar portion.

DETAILED DESCRIPTION

Embodiments will now be explained with reference to the accompanying drawings. The present invention is not limited to the embodiments.

A semiconductor device according to an embodiment is provided with a substrate, a stacked body provided on the substrate, and a pillar portion penetrating the stacked body. The pillar portion has a first film including a first material and a second material, and a second film provided on an inner side of the first film. The second material is a material that increases an etching rate of the first material as a composition rate relative to the first material increases, and the composition rate gradually decreases from an upper part to a lower part of the first film.

First Embodiment

Figure 1:
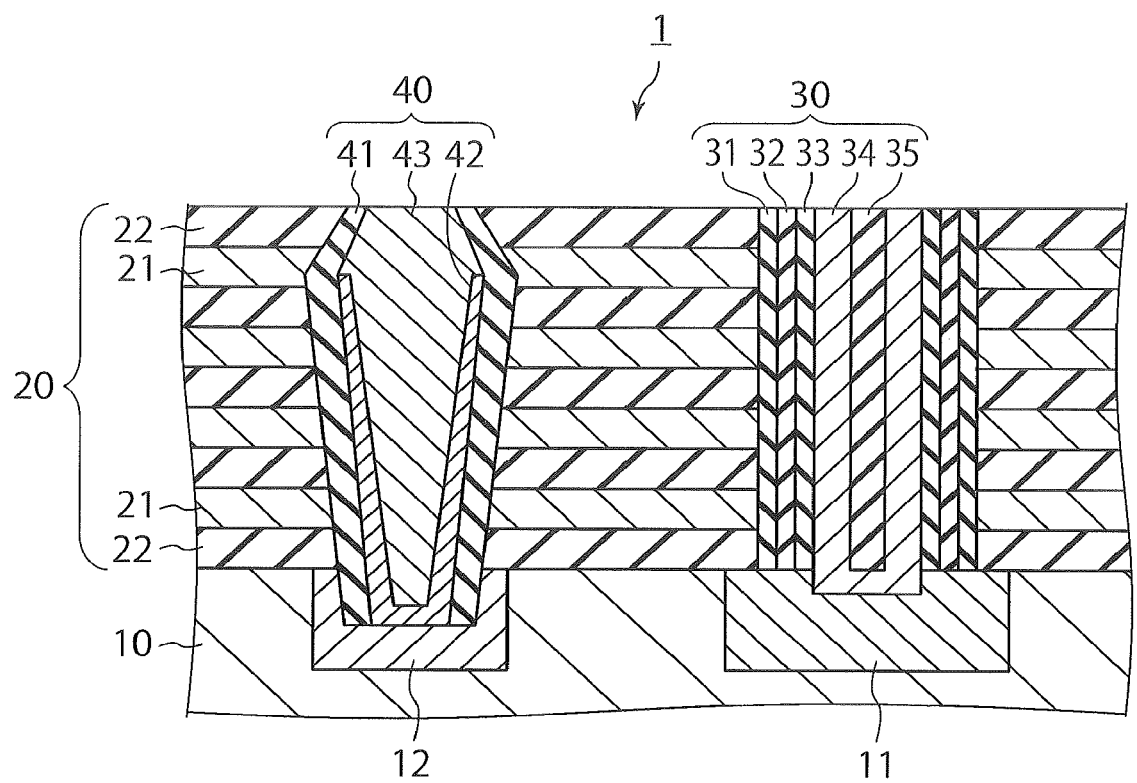
FIG. 1 is a cross sectional view showing a configuration of a main part of a semiconductor device according to a first embodiment.

FIG. 1 is a cross sectional view showing a configuration of a main part of a semiconductor device according to a first embodiment. A semiconductor device 1 shown in FIG. 1 is a three-dimensional stacked semiconductor memory having a memory cell array in a three-dimensional structure and is provided with a substrate 10, a stacked body 20, a pillar portion 30 and a pillar portion 40.

The substrate 10 is, for example, a silicon substrate. On an upper surface of the substrate 10, semiconductor areas 11 and 12 are formed. The semiconductor areas 11 and 12 are n-type silicon areas. The pillar portion 30 is formed on the semiconductor area 11. The pillar portion 40 is formed on the semiconductor area 12.

The stacked body 20 is an example of a workpiece. The stacked body 20 is provided on the substrate 10. The stacked body 20 has a plurality of electrode layers 21 and a plurality of insulating layers 22. The plurality of electrode layers 21 and the plurality of insulating layers 22 are alternately stacked. Each electrode layer 21 includes, for example, tungsten (W) and functions as a word line. The insulating layers 22 include, for example, silicon oxide ($SiO_2$) and insulation-separate the electrode layers 21, respectively.

The pillar portion 30 penetrates the stacked body 20 and has a block insulation film 31, an electric charge accumulating film 32, a tunnel insulation film 33, a channel film 34 and a core insulation film 35. The block insulation film 31, the electric charge accumulating film 32 and the tunnel insulation film 33 are examples of a memory film. The channel film 34 is an example of a semiconductor film.

The block insulation film 31 includes, for example, silicon oxide and faces the electrode layers 21 and the insulating layers 22. The electric charge accumulating film 32 includes, for example, silicon nitride (SiN) and faces an inner circumferential surface of the block insulation film 31. The tunnel insulation film 33 includes, for example, silicon oxynitride (SiON) and faces an inner circumferential surface of the electric charge accumulating film 32.

The channel film 34 includes, for example, polysilicon and faces an inner circumferential surface of the tunnel insulation film 33. The channel film 34 is connected to the semiconductor area 11. The core insulation film 35 includes, for example, silicon oxide and faces an inner circumferential surface of the channel film 34.

The pillar portion 40 penetrates the stacked body 20 and separates the stacked body 20 in a plurality of blocks. The pillar portion 40 has an insulation film 41 and electrically conducting films 42 and 43. The electrically conducting films 42 and 43 are examples of a first film and a second film, respectively.

The insulation film 41 is formed between the electrode layers 21 and the electrically conducting film 42. The insulation film 41 is, for example, a silicon oxide film. The electrically conducting films 42 and 43 are insulated from the electrode layers 21 by the insulation film 41.

The electrically conducting film 42 includes silicon and germanium. Silicon and germanium are examples of the first material and the second material, respectively. The electrically conducting film 42 is formed on an inner side of the insulation film 41 and is connected to the semiconductor area 12.

The electrically conducting film 43 includes amorphous silicon. The electrically conducting film 43 is provided on an inner side of the electrically conducting film 42.

A method for manufacturing the semiconductor device 1 according to the present embodiment will be described below. Here, a process for manufacturing the pillar portion 40 will be described.

Figure 2:
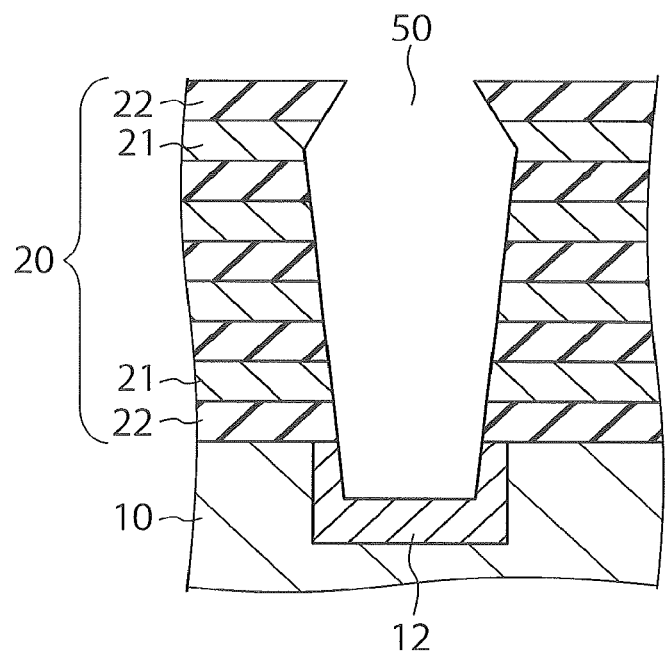
FIG. 2 is a cross sectional view showing a process for forming a groove in a stacked body.

First, a groove 50 that penetrates the stacked body 20 is formed on the semiconductor area 12 of the substrate 10 as shown in FIG. 2. A middle part of the groove 50 is curved outward. Note that the pillar portion 30 has been formed prior to formation of the groove 50.

Figure 3:
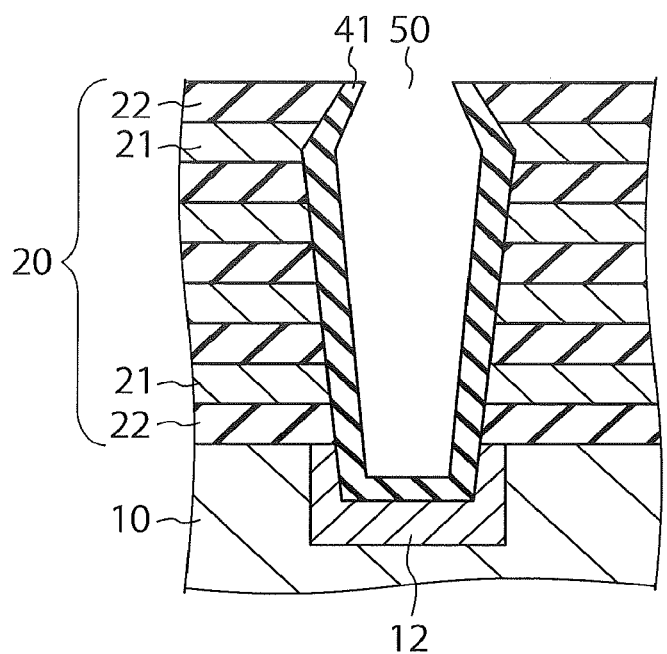
FIG. 3 is a cross sectional view showing a process for forming an insulation film in the groove.

Next, the insulation film 41 is formed in the groove 50 as shown in FIG. 3. The insulation film 41 can be formed, for example, by sputtering. Then, the insulation film 41 formed on a bottom surface of the groove 50 is removed.

Figure 4:
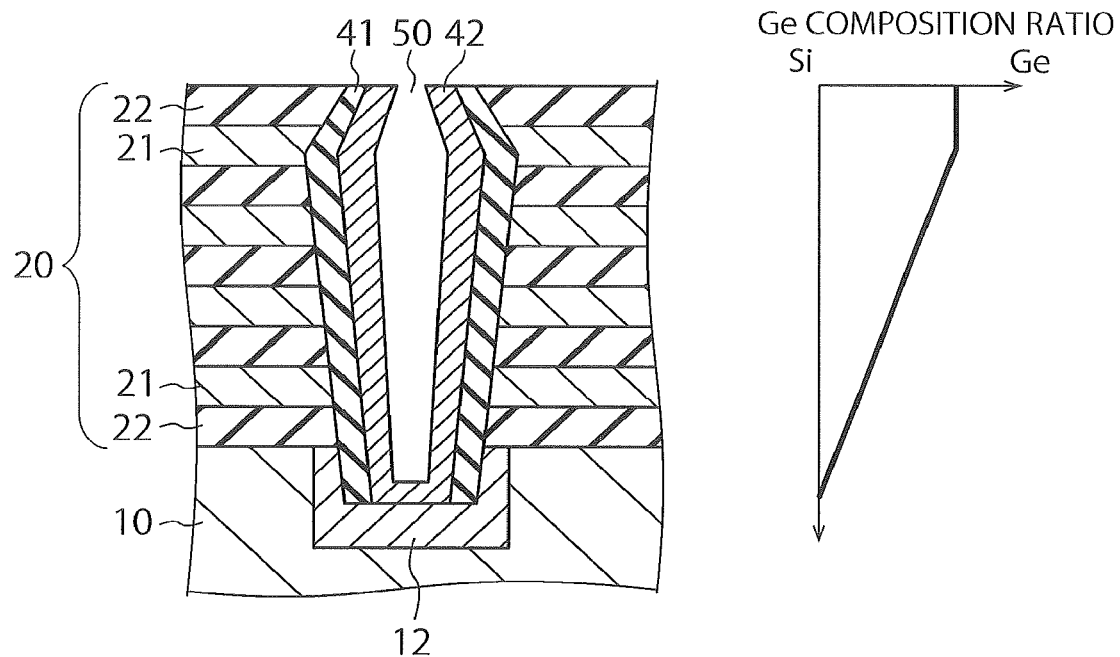
FIG. 4 is a cross sectional view showing a process for forming an electrically conducting film on an inner side of the insulation film.

Next, the electrically conducting film 42 is formed on the inner side of the insulation film 41 as shown in FIG. 4. The electrically conducting film 42 can be formed, for example, by CVD (chemical vapor deposition). The electrically conducting film 42 includes silicon and germanium. When the electrically conducting film 42 is formed under a film formation condition under which germanium is easily reduced, a composition rate of germanium relative to silicon gradually decreases from an upper part to a lower part of the electrically conducting film 42 as shown in FIG. 4.

As material gas for the electrically conducting film 42 that includes silicon and germanium, for example, monosilane ($SiH_4$) gas and germanium hydroxide ($GeH_4$) gas can be used. When a flow rate of monosilane gas is adjusted to 0.19 Pa m$^3$/s (113 sccm), and a flow rate of germanium hydroxide gas is adjusted to 0.76 Pa m$^3$/s (450 sccm) under a film formation condition that a film formation temperature is 400° C., and a pressure in a chamber is 200 Pa, the composition rate of germanium can be decreased from 60% to 40%, from the upper part to the lower part of the electrically conducting film 42.

Further, when the flow rate of monosilane gas is adjusted to 0.85 Pa m$^3$/s (500 sccm), and the flow rate of germanium hydroxide gas is adjusted to 0.17 Pa m$^3$/s (100 sccm) under the above film formation condition, the composition rate of germanium can be decreased from 20% to 0%, from the upper part to the lower part of the electrically conducting film 42.

Figure 5:
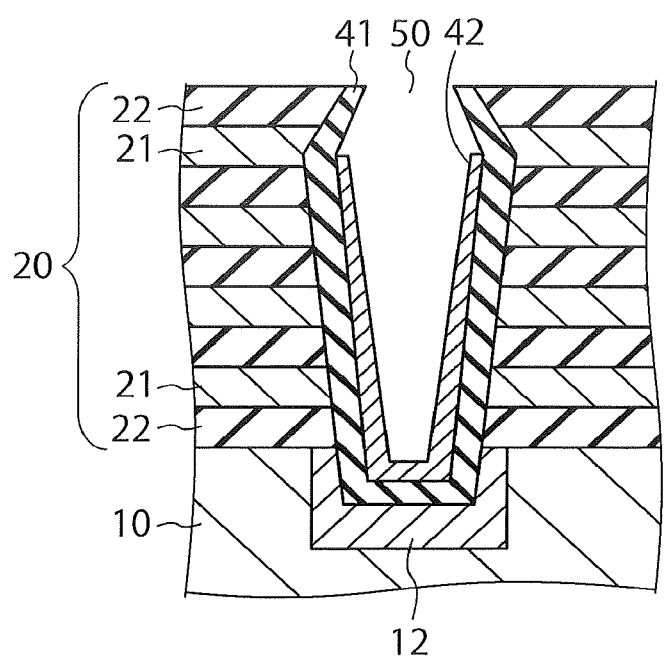
FIG. 5 is a cross sectional view showing a process for etching an upper part of the electrically conducting film.

Next, the upper part of the electrically conducting film 42 is etched as shown in FIG. 5. In the present embodiment, the composition rate of germanium relative to silicon gradually decreases from the upper part to the lower part of the electrically conducting film 42 as described above. The higher the composition rate of germanium (a germanium concentration) is, the higher the etching rate of silicon is. Therefore, the upper part of the electrically conducting film 42 with a high etching rate can be etched, with the lower part of the electrically conducting film 42 with a low etching rate being left. As a result, the electrically conducting film 42 is formed in a structure having a V-shaped section as shown in FIG. 5.

Lastly, the electrically conducting film 43 is formed by embedding amorphous silicon into the groove 50 as shown in FIG. 1. At this time, if the upper part of the electrically conducting film 42 has not been removed, there is a possibility that an upper end opening of the groove 50 is covered with the amorphous silicon before a lower part of the groove 50 is filled with the amorphous silicon. In this case, there is a concern that a cavity (a seam) occurs in the electrically conducting film 43, and deflective strength of the pillar portion 40 decreases.

According to the present embodiment, however, the upper part of the electrically conducting film 42 has been removed when the electrically conducting film 43 is formed. Therefore, it is possible to form the electrically conducting film 43 without causing the cavity to occur. Thereby, it becomes possible to improve film forming properties of the electrically conducting film 43.

Note that, in the present embodiment, composition of the electrically conducting film 42 is silicon and germanium. However, the material added to silicon may be any material that the etching rate of silicon increases as the composition rate relative to silicon is higher, and is not limited to germanium.

Second Embodiment

Figure 6:
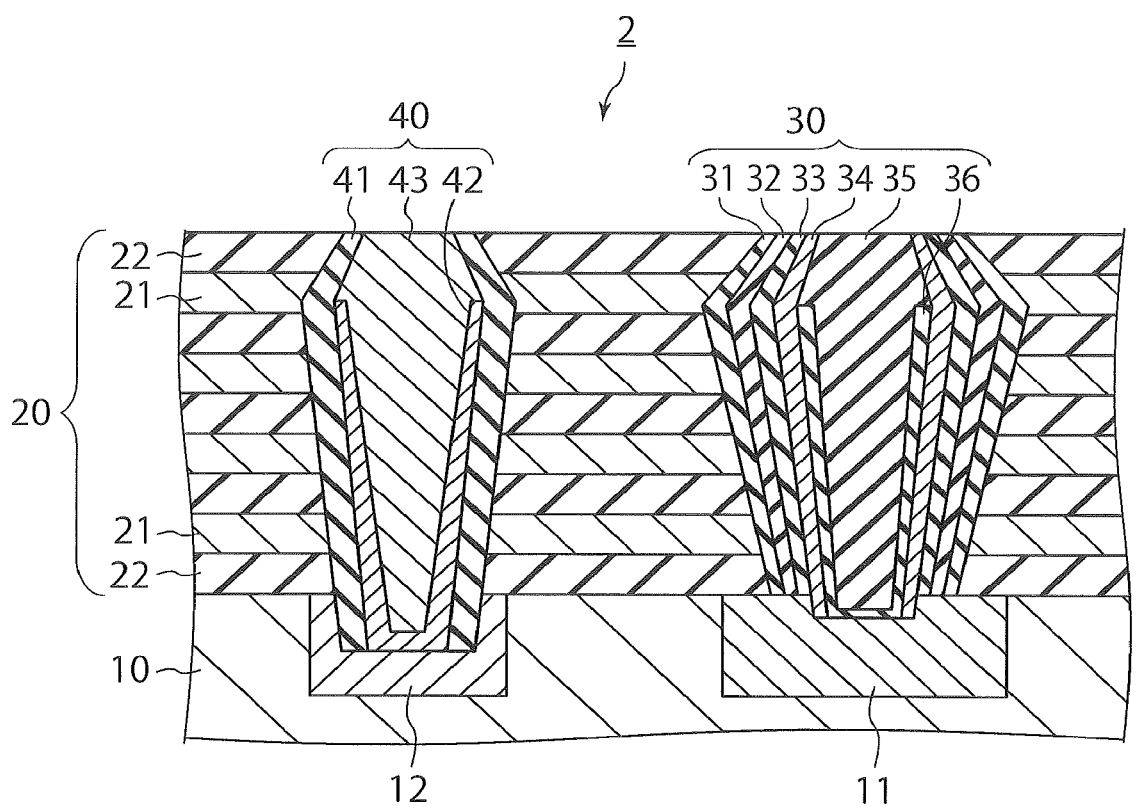
FIG. 6 is a cross sectional view showing a configuration of a main part of a semiconductor device according to a second embodiment.

FIG. 6 is a cross sectional view showing a configuration of a main part of a semiconductor device according to a second embodiment. Components similar to those of the first embodiment described above will be given the same reference numerals, and detailed description of the components will be omitted.

In a semiconductor device 2 according to the present embodiment, the pillar portion 30 has an insulation film 36 in addition to the block insulation film 31 to the core insulation film 35 described in the first embodiment as shown in FIG. 6. The insulation film 36 is formed between the core insulation film 35 and the channel film 34. In the present embodiment, the insulation film 36 is the first film, and the core insulation film 35 is the second film.

The insulation film 36 includes silicon, germanium and oxygen. The composition rate of germanium relative to silicon gradually decreases from an upper part to a lower part of the insulation film 36.

A method for manufacturing the semiconductor device 2 according to the present embodiment will be described below. Here, a process for manufacturing the pillar portion 30 will be described.

Figure 7:
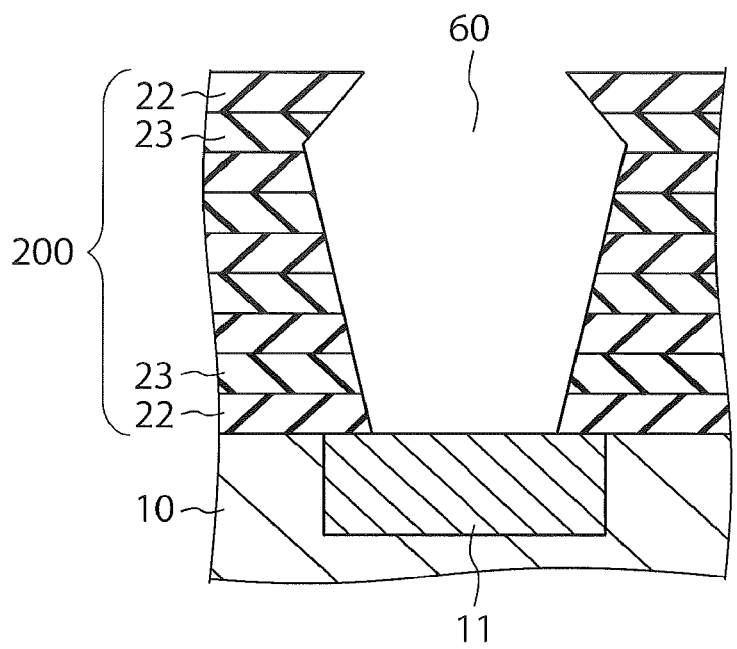
FIG. 7 is a cross sectional view showing a process for forming a hole in a stacked body.

First, a hole 60 that penetrates a stacked body 200 is formed on the semiconductor area 11 of the substrate 10 as shown in FIG. 7. In the stacked body 200, sacrificial layers 23 and the insulating layers 22 are alternately stacked. The sacrificial layers 23 are, for example, silicon nitride layers. Further, a middle part of the hole 60 is curved outward. Note that the pillar portion 40 has not been formed yet.

Figure 8:
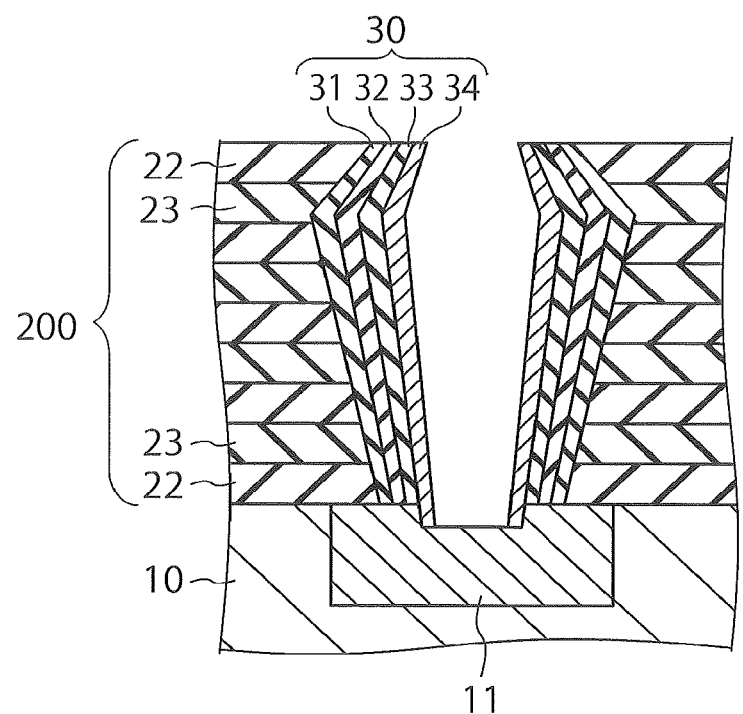
FIG. 8 is a cross sectional view showing a process for forming a memory film and a channel film in the hole.

Next, the block insulation film 31, the electric charge accumulating film 32, the tunnel insulation film 33 and the channel film 34 are sequentially formed in the hole 60 as shown in FIG. 8. The block insulation film 31, the electric charge accumulating film 32 and the tunnel insulation film 33 can be formed, for example, by CVD or ALD (atomic layer deposition). Further, the channel film 34 can be formed by embedding polysilicon into the hole 60.

Figure 9:
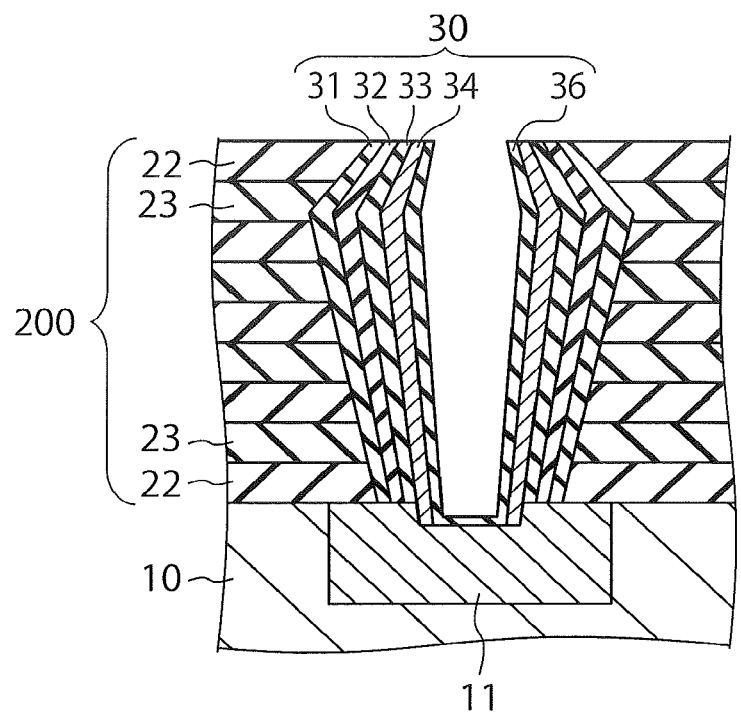
FIG. 9 is a cross sectional view showing a process for forming an insulation film on an inner side of the channel film.

Next, the insulation film 36 is formed on an inner side of the channel film 34 as shown in FIG. 9. The insulation film 36 can be formed, for example, by CVD. By forming the insulation film 36 under the film formation condition under which germanium is easily reduced, the composition rate of germanium relative to silicon is gradually decreased from the upper part to the lower part of the insulation film 36.

Figure 10:
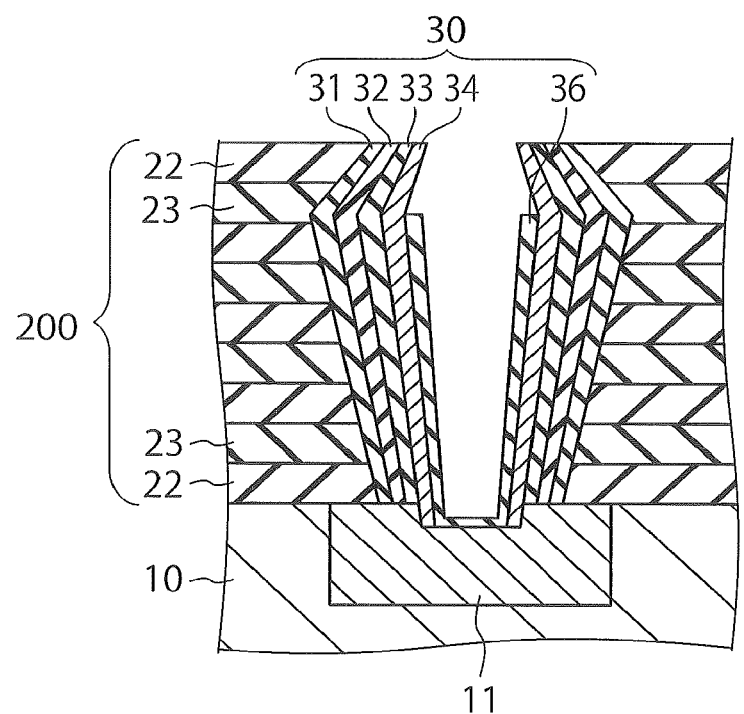
FIG. 10 is a cross sectional view showing a process for etching an upper part of the insulation film.

Next, the upper part of the insulation film 36 is etched as shown in FIG. 10. In the present embodiment, the composition rate of germanium relative to silicon gradually decreases from the upper part to the lower part of the insulation film 36 as described above. The higher the composition rate of germanium (the germanium concentration) is, the higher the etching rate of silicon is. Therefore, the upper part of the insulation film 36 with a high etching rate can be etched, with the lower part of the insulation film 36 with a low etching rate being left. As a result, the insulation film 36 is formed in a structure having a V-shaped section as shown in FIG. 10.

Figure 11:
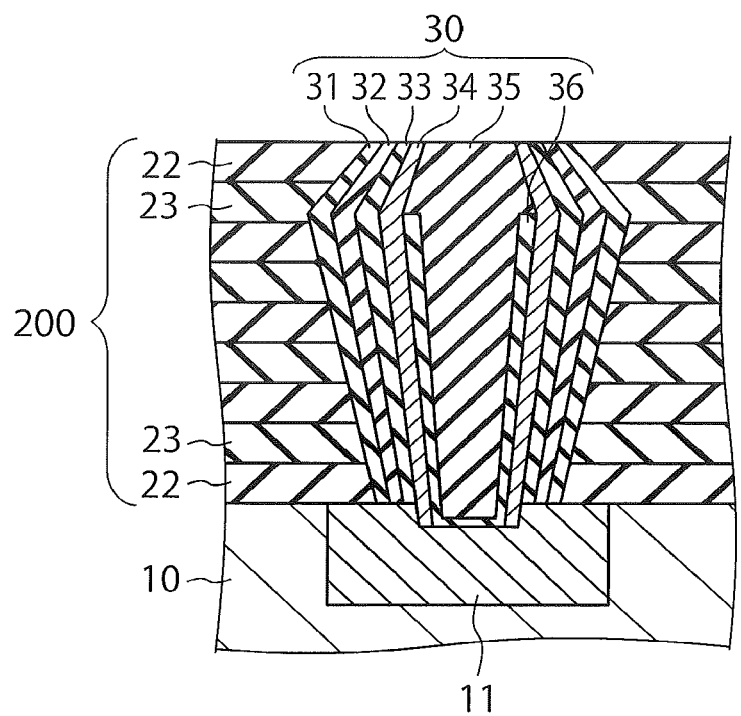
FIG. 11 is a cross sectional view showing a process for embedding a core insulation film.

Next, the core insulation film 35 is embedded into the hole 60 as shown in FIG. 11. Thereby, the pillar portion 30 is completed. After that, the groove 50 described in the first embodiment is formed, and the sacrificial layers 23 are etched using the groove 50. The electrode layers 21 are formed where the sacrificial layers 23 have been removed. After that, the pillar portion 40 is formed as described in the first embodiment.

The insulation film 36 is formed in the present embodiment described above. Therefore, even if the hole 60 for the pillar portion 30 is in a shape curved outward, the core insulation film 35 can be formed without causing a cavity (a seam) to occur. Thereby, it becomes possible to improve film forming properties of the core insulation film 35.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a substrate;
    a stacked body provided on the substrate; and
    a first pillar portion and a second pillar portion penetrating the stacked body, wherein
    the first pillar portion is a memory pillar,
    the second pillar portion comprises a first film including a first material and a second material, and a second film provided on an inner side of the first film,
    the second material is a material that increases an etching rate of the first material as a composition rate relative to the first material increases, and the composition rate decreases from an upper part to a lower part of the first film,
    the second pillar portion separates the stacked body into a plurality of blocks,
    the first film is formed in a structure having a V-shaped section of the second pillar portion, and
    the second pillar portion further comprises an insulation film provided on an outer side of the first film, and the insulation film is formed in a structure including a first part having the V-shaped section and a second part having a section that is angled towards a center of the second pillar.

2. The semiconductor device according to claim 1, wherein the first material is silicon, and the second material is germanium.

3. The semiconductor device according to claim 1, wherein
    the stacked body comprises a plurality of electrode layers, and a plurality of insulating layers alternately stacked with the plurality of electrode layers; and
    the first pillar portion further comprises a memory film facing the plurality of electrode layers, and a semiconductor film provided between the memory film and the first film.

4. The semiconductor device according to claim 1, wherein the first film and the second film are electrically conducting films.

5. The semiconductor device according to claim 1, wherein the first film and the second film are insulation films.

6. The semiconductor device according to claim 1, wherein the memory pillar comprises a core insulation film provided in a center of the memory pillar, and an insulation film provided in a lower portion of an outer peripheral portion of the core insulation film, and the insulation film includes germanium.

* * * * *